United States Patent

Meissner

[11] Patent Number: 6,025,060
[45] Date of Patent: *Feb. 15, 2000

[54] METHOD AND APPARATUS FOR COMPOSITE GEMSTONES

[75] Inventor: Helmuth E. Meissner, Pleasanton, Calif.

[73] Assignee: Onyx Optics, Inc., Dublin, Calif.

[ * ] Notice: This patent is subject to a terminal disclaimer.

[21] Appl. No.: 09/004,050

[22] Filed: Jan. 7, 1998

Related U.S. Application Data

[63] Continuation-in-part of application No. 08/580,730, Dec. 29, 1995, Pat. No. 5,846,638, which is a continuation-in-part of application No. 08/330,174, Oct. 27, 1994, abandoned, which is a division of application No. 07/919,374, Jul. 29, 1992, Pat. No. 5,441,803, which is a continuation of application No. 07/672,251, Mar. 20, 1991, abandoned, which is a continuation-in-part of application No. 07/597,987, Oct. 15, 1990, abandoned, which is a continuation of application No. 07/446,214, Dec. 5, 1989, abandoned, which is a division of application No. 07/238,563, Aug. 30, 1988, abandoned.

[51] Int. Cl.[7] ...................................................... B32B 7/02
[52] U.S. Cl. ...................... 428/220; 117/1; 148/DIG. 12; 148/DIG. 135; 156/153; 156/281; 428/408; 428/411.1; 428/700; 438/455
[58] Field of Search ........................ 117/1; 148/DIG. 12, 148/DIG. 135; 156/153, 281; 438/455; 428/220, 408, 411.1, 700

[56] References Cited

U.S. PATENT DOCUMENTS

| | | |
|---|---|---|
| 3,123,953 | 3/1964 | Merkl . |
| 3,565,508 | 2/1971 | Dumont . |

(List continued on next page.)

FOREIGN PATENT DOCUMENTS

| | | | |
|---|---|---|---|
| 1 136 050 | 4/1985 | European Pat. Off. . | |
| 456060 | 11/1991 | European Pat. Off. | 117/1 |
| 405255000A | 10/1993 | Japan . | |

OTHER PUBLICATIONS

McLellan, G.W., *Glass Engineering Handbook*, Third Edition, pp. 1–1 to 1–3 and 4–4 to 4–11.

H.C. Lee et al. Diffusion Bonded Composites of YAG Single Crystals. *SPIE*, vol. 1624, 1991. Laser–Induced Damage in Optical Materials. pp. 2–10.

Onyx Optics. Design Features and Applications of ONYX OPTICS' Crystal Composites Released May 1994. 3p.

(List continued on next page.)

*Primary Examiner*—Jeff H. Aftergut
*Attorney, Agent, or Firm*—David G. Beck; Townsend and Townsend and Crew, LLP

[57] ABSTRACT

A method and apparatus for creating unique gemstones is provided. The method comprises the steps of optically contacting the gemstones of interest followed by a heat treatment of the composite gemstone. The heat treatment step increases the bond strength and therefore the resistance of the bond to reversal. In one aspect of the invention, a composite gem is fabricated by bonding a naturally occurring gem to an artificial gem to form a single composite gemstone of large size that outwardly appears to be a single natural gem. The composite gem may be fabricated at a fraction of the cost of a natural stone of the same size. In another aspect of the invention, an intensely colored natural stone is bonded to a colorless or lightly colored artificial stone. This composite retains the intense color associated with the natural stone while enjoying the brilliance, depth, and size resulting from the combination of stones. In another aspect of the invention, various composite gemstones are fabricated using a variety of stones of both natural and artificial origin. The stones may be layered with two, three, or more layers. The composite gem may either take the form of a simple layered gem, or the composite gem may be in the form of a variety of three-dimensional shapes. In another aspect of the invention, the composite gem includes an engraved pattern at one or more internal gem interfaces. The engraving is completed prior to bonding the stones together and may convey either a two-dimensional or a three-dimensional image.

14 Claims, 6 Drawing Sheets

U.S. PATENT DOCUMENTS

| | | |
|---|---|---|
| 3,880,632 | 4/1975 | Podvigalkina . |
| 4,039,726 | 8/1977 | Carr et al. . |
| 4,149,902 | 4/1979 | Mauer et al. . |
| 4,509,175 | 4/1985 | Daly et al. . |
| 4,531,809 | 7/1985 | Carter et al. . |
| 4,638,552 | 1/1987 | Shimbo et al. . |
| 4,671,846 | 6/1987 | Shimbo et al. ............... 156/153 X |
| 4,983,251 | 1/1991 | Haisma et al. . |
| 5,013,380 | 5/1991 | Aoshima ............... 156/250 |
| 5,169,472 | 12/1992 | Goebel ............... 156/281 |
| 5,201,977 | 4/1993 | Aoshima ............... 156/153 |
| 5,441,803 | 8/1995 | Meissner ............... 428/220 |
| 5,846,638 | 12/1998 | Meissner ............... 117/1 X |

OTHER PUBLICATIONS

H.F. Fischmeister et al. Preparation, Properties and Structure of Metal/Oxide Interfaces. *Mat. Res. Soc. Symp. Proc.*vol. 122, 1988. pp. 529–540.

Webster's New Collegiate Dictionary, 1977, p. 46.

C.T. Yen et al. On Controlled Solidification Studies of Some $TiO_2$ Binary Alloys. *J. Mater. Res.* vol. 7, No. 4, Apr. 1992. pp. 980–991.

Hidemi Tajima et al. Performance of Composite Glass Slab Laser. *IEEE J. of Quantum Electronics.*vol. 28, No. 6, Jun. 1992. pp. 1562–1570.

Haisma, J. et al., Silicon–on–Insulator Water Bonding–Wafer Bonding Thinning Technological Evaluations, *Japanese Journal of Applied Physics*, vol. 28, No. 8, Aug. 1989, pp. 1426–1443.

H.C. Lee et al. Single Crystal Composites for EO Applications, *Optics in Montana '91*: Topical Meeting on CTH:YAG. vol. 1. Aug. 13–15, 1991. 12 pp.

S.R. Bowman et al. Power Scaling of Diode–Pumped 2–Micron Lasers, LEOS '93. Nov. 15–18, 1993. 34 pp.

Van Bueren et al., A Small Stable Continuous Gas Laser, *Physics Letters*, vol. 2, No. 7, Nov. 2, 1962, pp. 310–341.

Black R.D. et al., Silicon and silicon dioxide thermal bonding for silicon–on–insulator applications, *J. Appl. Phys.* 63(8), Apr. 15, 1988, pp. 2773–2777.

Furukawa, K. et al. Lattice Configuration and Electrical Properties at the Interface of Direct Bonded Silicon, *Extended Abstracts of the 18th (1986 Internal) Conference on Solid State Devices and Materials*, Tokyo, 1986, pp. 533–536.

METHOD AND APPARATUS FOR COMPOSITE GEMSTONES

CROSS REFERENCE TO RELATED APPLICATIONS

This application is a Continuation-in-Part of application No. 08/580,730, filed Dec. 29, 1995, now U.S. Pat. No. 5,846,638, which is a Continuation-in-Part of application Ser. No. 08/330,174, filed Oct. 27, 1994, now abandoned, which is a Divisional of application Ser. No. 07/919,374, filed Jul. 29, 1992, now U.S. Pat. No. 5,441,803, which is a Continuation of application Ser. No. 07/672,251, filed Mar. 20, 1991, now abandoned, which is a Continuation-in-Part of application Ser. No. 07/597,987, filed Oct. 15, 1990, now abandoned, which is a Continuation of application Ser. No. 07/446,214, filed Dec. 5, 1989, now abandoned, which is a Divisional of application Ser. No. 07/238,563, filed Aug. 30, 1988, now abandoned, the complete disclosures of which are incorporated herein by reference for all purposes.

FIELD OF THE INVENTION

The present invention relates generally to jewelry and, more particularly, to composite gemstones formed by bonding together multiple gemstones, preferably of both natural and artificial origin.

BACKGROUND OF THE INVENTION

Certain colored stones and crystals have been sought and prized for their beauty beginning with ancient civilizations and continuing into the modern age, even to the extent of ascribing to them magical powers. Through appropriate cutting and polishing, the value and natural beauty of a precious stone may be further enhanced. While a vivid color is not always a requirement for a jewel, i.e., cut stone, it is an important attribute of red ruby, blue sapphire or green emerald. Furthermore, the color or lack thereof may be an important attribute of relatively clear gems, such as diamonds.

Besides its visual beauty, a gemstone for ornamental purposes has to possess a certain amount of durability to be classified as precious, since it should be displayable by the owner without fear of deterioration or tarnish. Gemstones of the requisite hardness to qualify as durable include gem varieties derived from corundum (e.g., ruby, sapphire) and from carbon (e.g., diamond). Such gemstones typically not only outlive their wearers but also sparkle with undiminished luster long after their metal setting has been abraded or eroded.

Finally, naturally occurring gemstones generally are of higher inherent value than artificially grown gems, regardless of the fact that artificial stones often are of purer color and higher internal crystal quality. Although this result is probably attributable to the lack of rarity in the artificial stone, some minor flaws in naturally occurring stones are thought to add beauty and character to the final jewel.

Naturally occurring gemstones may exhibit undesirable color zones in which the color is distributed unevenly in the gem. The uneven color zones generally make it more difficult for the lapidary to select the direction in which the gem should be advantageously cut. On the other hand, colorless crystals often are less attractive than colored ones. Heat treatment of corundum to change its color or to remove some color zones has been practiced extensively. Other techniques, for example as disclosed in U.S. Pat. No. 4,039,726, consist of changing the color of corundum by diffusing chromophores such as iron/titanium, chromium, chromium/nickel, or chromium/iron/titanium into natural or artificial crystals at temperatures typically above 1700° C.

There have been numerous attempts to combine colorless crystals with colored crystals, or to impart color by using dyed epoxy when setting or combining them. Although gemstones that are bonded with colored epoxy or other adhesives have reached a certain amount of popularity as fashion jewelry, they often are not as durable as desirable, and therefore cannot reach the quality of heirloom jewelry. Other techniques of combining crystals employ metal solders, brazes or mechanical means to hold crystals in place with respect to each other. A distinct disadvantage of this type of joining is the opaqueness of the bonding material that effectively separates the gems from each other.

Natural gemstones often exhibit such an intensive coloration that they appear black in larger sizes. To show their beautiful color to best advantage, they have to be faceted as smaller stones, which in turn reduces their rarity, value and effect. A prime example is Australian sapphire that has to be cut into small gems to show their blue color. In order to avoid cutting a large stone into small gems, intensely colored stones are sometimes cut into very shallow gems. Unfortunately the reduced gem thickness associated with this technique reduces the final jewel's brilliance due to the loss of light reflections.

A composite gemstone that combines the benefits of natural and artificially grown gems without suffering from the disadvantages associated with adhesive bonding is therefore desired.

SUMMARY OF THE INVENTION

The present invention provides a method of creating unique gemstones. The method comprises the steps of optically contacting the gemstones of interest followed by a heat treatment of the composite gemstone. The heat treatment step increases the bond strength and therefore the resistance of the bond to reversal. Prior to optical contacting, the surfaces of the gems to be contacted must be sufficiently polished and matched to allow the complete disappearance of interferometric fringes at the interface once the surfaces are brought into contact, thereby indicating optical contacting. The temperature of the heat treatment step is generally greater than 80° C. and less than 0.9 times the melting temperature of any component within the composite.

In one aspect of the invention, a composite gem is fabricated by bonding a naturally occurring gem to an artificial gem to form a single composite gemstone of large size that outwardly appears to be a single natural gem. Once the bonding process is complete, the composite gem is cut and polished as desired. The composite gem can be fabricated for a fraction of the cost of a natural stone of the same size. An example of a composite gem of this type is the combination of a diamond with an artificially grown stone such as cubic zirconia.

In another aspect of the invention, an intensely colored natural stone is bonded to a colorless or lightly colored artificial stone. This composite retains the intense color associated with the natural stone while enjoying the brilliance, depth, and size resulting from the combination of stones. Furthermore, by adjusting the relative thicknesses of the two stones, the color of the composite may be controlled in order to achieve the desired color.

In another aspect of the invention, various composite gemstones are fabricated using a variety of stones of both natural and artificial origin. The stones may be layered with two, three, or more layers. The composite gem may either take the form of a simple layered gem, or the composite gem may be in the form of a variety of three-dimensional shapes.

In another aspect of the invention, the composite gem includes an engraved pattern at one or more internal gem interfaces. The engraving is completed prior to bonding the stones together. The engraving may either be completed after surface preparation or before final surface preparation. If the engraving is completed after surface preparation, the engraving process must not damage the non-engraved portions of the interface as such damage would prevent the non-engraved portions from being able to form an optically contacted interface with the adjoining gem surface. The engraved design may include drawings, letters, logos, etc. and designed to convey either a two-dimensional or a three-dimensional image.

A further understanding of the nature and advantages of the present invention may be realized by reference to the remaining portions of the specification and the drawings.

DETAILED DESCRIPTION OF THE INVENTION

Composite Formation Techniques

Two steps are common to the formation of any composite by the method of the present invention; optical contacting and heating the optically contacted composite. Although the term optical contacting is often used incorrectly to describe a variety of contacting procedures, as applied to the present invention optical contacting is characterized by the complete absence of interferometric fringes at the optically contacted interface as discerned by the unaided eye. Thus optical contacting implies that there are no areas at the interface which contain gaseous or solid inclusions since such inclusions would prevent the disappearance of interference fringes in the vicinity of the inclusion. Optical contacting is therefore a necessary condition for obtaining interfaces between two surfaces that are essentially free of defects.

Figure 1A:
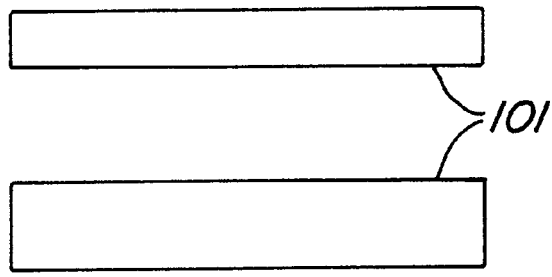
FIGS. 1A–C schematically illustrate the sequence of steps required to form a composite according to the present invention.
Figure 1B:
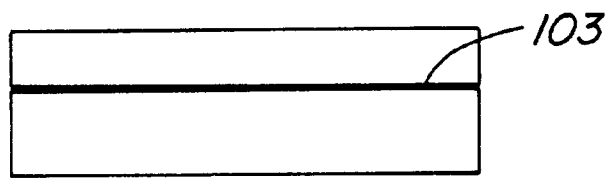
Figure 1C:
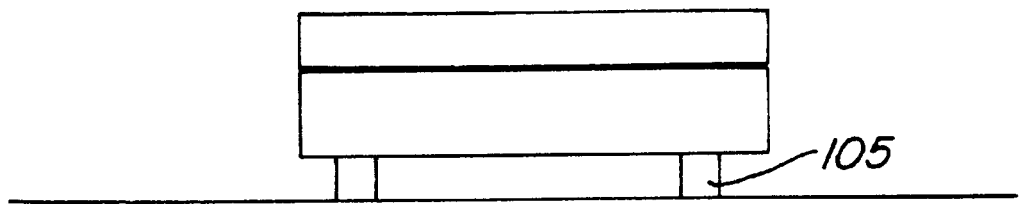

FIGS. 1A–C schematically illustrate the method of the present invention. In FIG. 1A two optically polished surfaces 101 are brought into juxtaposition while FIG. 1B illustrates the two surfaces being placed in optical contact at an interface 103. If optical contact is not established as evidenced by the disappearance of visible interference fringes at the interface, the composite is rejected. Typically, rejected composites can be separated, undergo further preparation, and be reassembled. This process must be repeated until optical contact has been established and no defects remain at the interface.

In preparing the surfaces for optical contacting, the surfaces are polished using conventional grinding and polishing techniques. Although the present invention is equally applicable to flat and non-flat surfaces, it is critical that the figure of the two surfaces substantially match and that each of the surfaces has been adequately polished. Ultimately, if the surfaces are properly matched and have been sufficiently polished, optical contact can be achieved.

As an example of the requirements on surface figure, if the two surfaces to be bonded are flat, typically the flatness must be on the order of one wave of visible light for every 5 to 10 centimeters of surface. This requirement, however, varies with the aspect ratio of the components to be bonded. For example, if one of the components is extremely thin, it will tend to deform to a small degree in order to match the surface of the complimentary component. If, on the other hand, both components are quite thick, it is unlikely that either component will undergo measurable deformation. Thus the figure requirement for the thin component is not as stringent as that imposed on the thick component.

If desired, prior to optical contacting one or both surfaces may be optically coated with reflection, anti-reflection, polarizer, or other specialized coatings.

After optical contacting of the two components has been achieved, the optically contacted composite is subjected to a heat treatment as illustrated in FIG. 1C. In FIG. 1C the composite rests on a pair of support surfaces 105 during heat treatment. The support surface or surfaces may consist of any of a number of different materials; for example, graphite, polycrystalline ceramic, or fused silica. Further, the support may be coated with a release agent. It is important, however, that the support structure neither adhere to nor react with the composite. Furthermore the support structure should not react with the furnace, thereby resulting in contamination.

Although for many composites the heat treatment step can be performed under ambient conditions, some composites may require a specialized environment during processing due to cleanliness requirements or the reactivity of the individual components. Therefore if necessary this step may be performed in a clean room, in a vacuum, in a gas-filled glove box where the gas is an inert gas or some other non-reactive gas, or in another form of specialized environment.

Once the optically contacted assembly has undergone proper heat treatment, it acquires a bond strength and resistance to bond reversal that is greater than that of the untreated assembly. The extent of heat treatment depends on the intended use and the materials forming the composite. Typically a minimum heat treatment temperature of 80° C. is necessary. This level of heat treatment is sufficient for many applications. The maximum temperature of heat treatment must remain within the range of the physical and/or crystallographic stability of the materials to be bonded.

For glass-containing composites, the heat treatment temperature should generally not exceed the glass transformation temperature of any component within the composite by more than 1.3 times. At these temperatures the risk of distortion is minimized, as is the chance of a side reaction such as devitrification. For crystalline or polycrystalline materials, the maximum heat treatment temperature should generally not exceed 0.9 times the melting temperature of any component within the composite. Melting is not required for bond formation. Heat treatment at lower temperatures causes diffusion of gaseous species, mainly water vapor, at the interface between the two bodies. Some inter-diffusion between species of adjacent surfaces will occur at more elevated temperatures. These species may be vacancy sites, oxygen ions, or possibly cations. The theoretical mechanism of bonding is not critical for the present invention and is in fact not completely understood and is believed to vary for different substances. It is essential that heat treatment temperatures not be raised to a level that causes defects at the interface, e.g by recrystallization, or beyond the physical stability of the materials of the construct.

The length of time required for heat treatment varies depending upon such factors as the materials to be bonded, the size of the bond interface, the heat treatment/bonding temperature, and the desired application. Typically a heat treatment period on the order of 8 to 50 hours is desirable, although shorter or longer periods may be necessary depending upon the specific application.

The rate at which the heat treated composite may be cooled back to room temperature depends on the materials characteristics of the components. For glass-containing substances, a specific annealing cycle has to be followed depending on the size of the composite structure, as is known in the art of glass annealing. Some crystals require a specific annealing rate to reduce stress while others may be cooled as fast as their thermal shock resistance allows.

The orientation of the composite during heat treatment is not limited to horizontal interface positions. In fact, generally interfaces may be oriented at any angle during heat treatment.

Composite Gemstones

The above-described composite formation techniques have been applied to develop a new class of gemstones with unique qualities. Preferably the composite gemstones include at least one portion of a natural stone and one portion of an artificial stone, although composites containing only natural or only artificial stones may be fabricated as desired. This new class of gemstones affords the lapidary the freedom of designing new gemstone configurations, for example stones containing different bands of colors. Composite gemstones may also be formed in which a naturally occurring stone (e.g., diamond) is invisibly coupled to an artificial stone, thus achieving a large gem exhibiting the characteristics of a naturally occurring gem.

The present formation technique does not utilize an adhesive material, rather it relies on a thermal bonding technique to enhance the molecular and ionic attractive forces at precision polished surfaces which have been previously optically contacted. A distinct advantage of composite gems that are thermally bonded according to the present invention is the smooth transition at the scatter-free bond interface. Assuming materials of essentially the same refractive index, such as artificial sapphire and natural sapphire, this bond interface may be invisible to the eye.

Furthermore, composite gems containing color combinations of similar (e.g., YAG and colored YAG) or dissimilar crystals are possible, both in simple patterns and more intricate designs. Another group of starting materials consists of heat treated natural corundum crystals, or natural or artificially grown corundum where coloration has been achieved by an in-diffusion process of a polished surface. Although flat interface surfaces are typically utilized, non-flat interfaces may also be used in order to form more exotic composites. However, given the difficulty and associated costs of preparing and polishing the interfaces to the required accuracy, flat surfaces are preferred.

According to the present invention, components for a composite gemstone are precision polished and optically contacted as described above. Although after optical contacting the individual components develop a room temperature bond, this bond is typically insufficient to withstand subsequent gem processing (e.g., cutting and polishing). However, after thermal treatment the assembly has sufficient strength to resist debonding during subsequent finishing operations and indefinitely thereafter. By repeating the process of surface preparation, optical contacting, and thermal treatment, increasingly complicated composite shapes may be attained.

Figure 2:
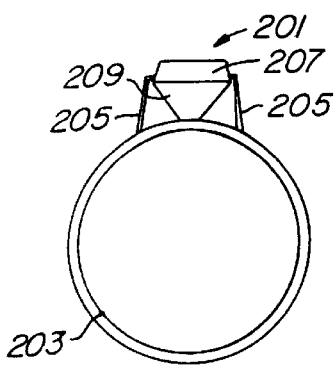
FIG. 2 illustrates a composite gem fabricated according to the present invention that is set within a finger ring.

FIG. 2 illustrates one embodiment of the present invention. A composite gem 201 fabricated according to the invention is mounted in a ring 203 with gem mounting prongs 205. In this embodiment composite gem 201 is fabricated from a naturally occurring diamond 207 and an artificially grown gem 209 such as cubic zirconia, although other composites can be used. Thus a very large composite gem 201 is used for a fraction of the cost of a same-sized natural stone.

Figure 3:
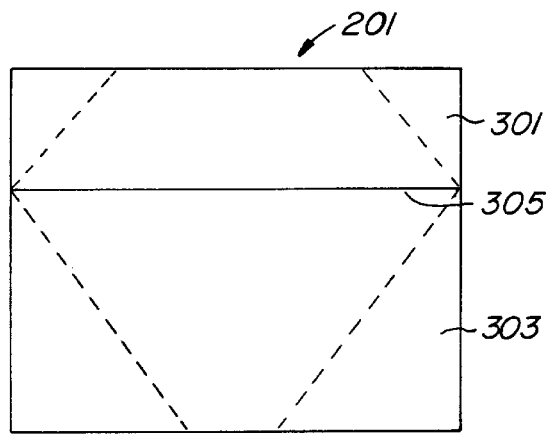
FIG. 3 illustrates an artificial gemstone coupled to a naturally occurring gemstone.

In the embodiment illustrated in FIG. 2, it is desirable to create a relatively large composite gem that all but the most knowledgeable observer would believe to be a natural gem comprised of a single stone. In this embodiment the two gems, 207 and 209, are matched to a high degree. For example, the color of the two gems is preferably matched. However any minor flaws contained in natural gem 207 would cause an observer to believe the entire composite to be of a natural origin. In this embodiment prior to gem cutting and polishing, a natural gem 301 is matched to an artificial gem 303 as illustrated in FIG. 3. The surfaces to be bonded are then polished, optically contacted, and thermally bonded along an interface 305 as described above. Preferably the lapidary cuts and polishes the gem in order to create the desired jewel, composite gem 201, after the bonding process is complete, thus creating a seamless interface. Jewel 201 may then be mounted in a variety of settings, such as that shown in FIG. 2.

Figure 4:
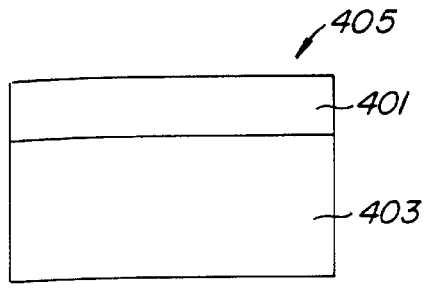
FIG. 4 illustrates a composite gemstone comprising an intensely colored stoned coupled to a colorless or lightly colored artificial gem.

Another advantage of combining a natural stone with an artificial stone is in order to take advantage of an intensely colored stone which otherwise would have to be shallow cut. For example, an Australian sapphire 401 may be bonded to a colorless or lightly colored artificial stone 403 as illustrated in FIG. 4. Once bonded in accordance with the present invention, the composite gem 405 may be cut and polished as desired. Thus composite gem 405 retains the intense color associated with natural stone 401 while enjoying the brilliance, depth, and size resulting from the combination of stones 401 and 403. Furthermore, by adjusting the relative thicknesses of stones 401 and 403, the color of the composite gem 405 may be controlled to achieve the desired color.

Figure 5:
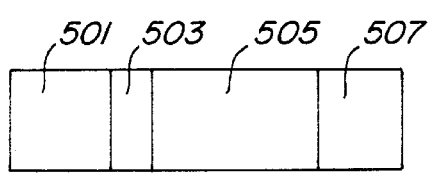
FIG. 5 illustrates a multi-layered composite gemstone.
Figure 6:
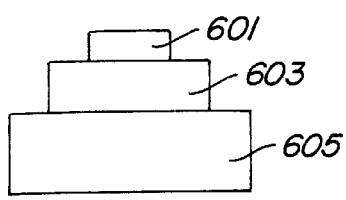
FIG. 6 illustrates a multi-layered composite gemstone in which the individual layers are of different size.
Figure 7:
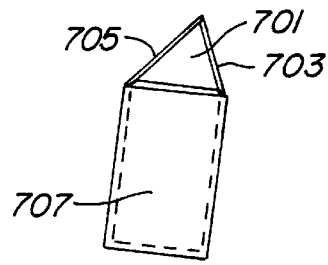
FIG. 7 illustrates a composite gemstone comprised of an inner three-sided stone onto which three individual outer stones have been attached.

A variety of both naturally occurring and artificially grown stones may be combined in limitless combinations utilizing the present invention. Examples of naturally occurring stones include diamonds, aluminum oxide derived stones (e.g., ruby, black, or yellow sapphire), red Almadine garnets, etc. Examples of artificially prepared stones include yttrium aluminum garnet (YAG), alumina, sapphire, cubic zirconia, beryl, alexandrite, gadolinium gallium garnet (GGG), etc. The color of the artificially grown stones may be controlled using a variety of techniques well known by crystal growers. For example, YAG crystals may be doped with a variety of dopants in varying concentrations to yield different color crystals. Dopants include chromium, iron, titanium, thulium, holmium, etc. In some instances, an artificially grown garnet such as GGG may be colored by simply adding an inorganic coloring agent to the melt during growth. The composite gemstones may be comprised of artificially grown stones only, natural stones only, or some combination thereof The composite stone may include as few as two different stones or as many different stones as desired. Prior to cutting and polishing, the individual stones of the composite gem may be bonded in a layered configuration. For example, FIG. 5 illustrates a composite stone comprised of layers 501, 503, 505, and 507. Furthermore, the layers need not be of the same size, e.g., FIG. 6 illustrates a small stone 601 bonded to a larger stone 603 bonded to a larger stone 605. Alternative configurations are also possible, for example the individual stones may be bonded in a variety of three-dimensional shapes. FIG. 7 illustrates a composite stone comprised of an inner three-sided stone 701 onto which slabs 703, 705, and 707 have been bonded.

The ability to fabricate composite gems according to the present invention offers the skilled gem artisan endless possible variations. For example, a stone that is softer than desired but with an appealing color may be combined with a stone offering high hardness. Thus the outer, exposed surface is suitably scratch resistant while the lower, protected stone provides the color. For instance, artificial stone $Cr^{3+}$:YAG may be combined with a clear artificially grown aluminum oxide derived stone (e.g., sapphire), the sapphire providing the desired hardness.

Figure 8:
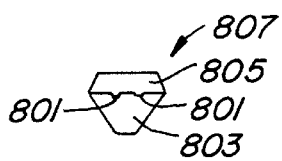
FIG. 8 illustrates the cross-section of a composite stone in which one of the surfaces of the composite interface has been engraved.
Figure 9:
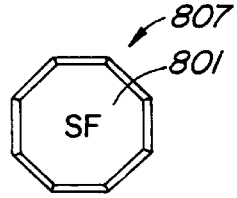
FIG. 9 illustrates a top-view of the composite gemstone shown in FIG. 8.

The present invention may also be used to fabricate a composite gem that includes an engraved pattern at the interface. In this embodiment the engraved portion represents an unbonded area at the interface. However, typically the remaining portions of the interface provide sufficient bonding strength for the composite gem to survive further processing and to last indefinitely. FIG. 8 illustrates one configuration of this embodiment in which a design 801 consisting of initials is engraved into stone 803. After engraving, stone 803 is bonded to stone 805 using the optical contacting and thermal treatment process of this invention. Composite stone 807 then undergoes any additional processing, such as cutting and polishing facets into the stones as desired. The final result is a stone of high quality and durability in which the engraved design appears to float. For example as seen from above, design 801 would simply be in the interior of composite jewel 807 as illustrated in FIG. 9. The engraved design may include drawings, letters, logos, etc. and designed to convey either a two-dimensional or a three-dimensional image.

Composite Optical Waveguides

A variety of waveguide structures may be fabricated using the composite fabrication techniques of the present invention, as described above. Composite waveguide structures exhibit a unique set of performance parameters thereby offering distinct advantages over the prior art. For example:

(i) The present invention results in a reduction in the losses occurring at the interfaces, primarily those losses associated with scattering. The resultant low losses provide much higher damage thresholds.

(ii) The present invention is applicable to a wide range of materials, for example: existing crystalline laser media such as Nd:YAG, Yb:YAG, GGG, GSGG, sapphire and YLF; non-linear optical crystals such as potassium titanyl phosphate (KTP) and its isomorphs; $LiNbO_3$, $KNbO_3$ and their isomorphs; potassium dihydrogen phosphate and its isomorphs; and nonlinear borate crystals.

(iii) The techniques of the present invention are applicable to high yield production quantities.

(iv) The present invention can be used with materials that exhibit a wide range of refractive indices, extending from fluoride crystals of about 1.33 refractive index for NaF to over 2 for $KNbO_3$ and $KTaO_3$.

(v) Multimode and single mode waveguides of precise dimensions can be fabricated using the present invention as well as square or rectangular buried channels. Dimensions for the guiding layers or cores of the order of about 4 $\mu$m to about 100–500 $\mu$m are possible.

(vi) The length of the waveguide structures fabricated using the present invention can be up to 100–200 mm. Similarly, one or two-dimensional arrays can be constructed.

(vii) Using the present invention waveguide structures can be bonded to other laser-active or inactive components, nonlinear optical crystals, optical fibers, beam launching modules, and laser pump modules in order to obtain a multifunctional device. The fabricated devices can also contain optical coatings at the interfaces.

Waveguide structures of the present invention allow the realization of the intrinsic advantages of solid state waveguide lasers over their bulk counterparts.

Confinement of the mode volume by the small dimension of the laser-active region increases the product of the pump intensity and the interactive length. Quasi-3-level lasing transitions and upconversion can readily be saturated. Therefore, many more lasing transitions become accessible to lasing than is possible with bulk solid state lasers. Similar considerations hold for waveguide versus bulk nonlinear optical media where the concentration of laser radiation into the guiding layer results in increased efficiency of harmonic frequency conversion.

Many combinations for waveguide structures are conceivable and useful for specific electro-optical devices according to this invention. Only a few of the more commonly available materials are enumerated by way of example to demonstrate the wide scope of the invention.

Solid state waveguide lasers can be constructed from the pairs of laser-active core or guiding layers, containing laser-active ions doped into their crystalline or amorphous network, and either single or double layers of cladding of undoped or differently doped components as provided in Table I.

TABLE I

| Laser-Active Core or Guiding Layer | Cladding Layer or Layers |
| --- | --- |
| YAG | YAG, Sapphire |
| LuAG | Yag, LuAG |
| GSGG | GSGG, GGG, YAG, Sapphire |
| $YVO_4$ | $YVO_4$ |
| $GdVO_4$ | $YVO_4$ |
| $YLiF_4$ | $YLiF_4$, $CaF_2$, $MgF_2$ |
| $LuLiF_4$ | $YLiF_4$, $LuLiF_4$ |
| LiSAF | LiSAF |
| NYAB | YAB |

TABLE I-continued

| Laser-Active Core or Guiding Layer | Cladding Layer or Layers |
| --- | --- |
| S-FAP | S-FAP |
| Glass | Glass |

Nonlinear optical waveguides can be constructed from the combinations of nonlinear-optical waveguiding cores or layers and cladding layers which are in either the same or different crystallographic orientations as provided in Table II.

TABLE II

| Waveguiding Core or Layer | Cladding Layer or Layers |
| --- | --- |
| $LiNbO_3$ | $LiNbO_3$ |
| $KNbO_3$ | $LiNbO_3$, $KNbO_3$ |
| $LiTaO_3$ | $LiNbO_3$, $LiTaO_3$ |
| LBO | BBO |
| KTP | KTA |
| KTA | KTP |
| CsTP | KTP |

Preferably configurations of waveguide structures according to the present invention are restricted to straight planar interfaces between guiding and cladding layers. The fabrication of other common waveguide structures are generally problematic due to the difficulties associated with the production of cylindrical interfaces between the guiding and cladding layers. Similarly, the one-step fabrication of layered structures with a bend requires a degree of accuracy which is difficult to achieve since it involves the simultaneous optical contacting of two surfaces which enclose a non-zero angle with each other.

In order to obtain waveguide cores of low stress it is very important that the surfaces to be bonded have very accurate surface figures. The more the two surfaces conform to each other the less elastic deformation is necessary to bring them into optical contact, therefore leading to lower stress. Also of great importance is the reduction of subsurface damage. Subsurface damage such as micro-fissures are known to extend 50 to 100 micrometers into the polished surface. When the core is only tens of micrometers thick, it is desirable to maintain subsurface damage at as low a level as possible by carefully removing most subsurface damage introduced during the previous finishing step. The level of stress in the core is also dependent on the waveguide configuration. Sandwich-type structures appear to exhibit less stress than channel-type structures. Heat treatment of waveguide structures is kept close to the lower level of the operable temperature range to avoid introduction of stress and scatter at the interfaces. It is also possible to fabricate structures in which the core exhibits uniaxial stress, resulting in polarization maintaining waveguide structures.

Figure 10:
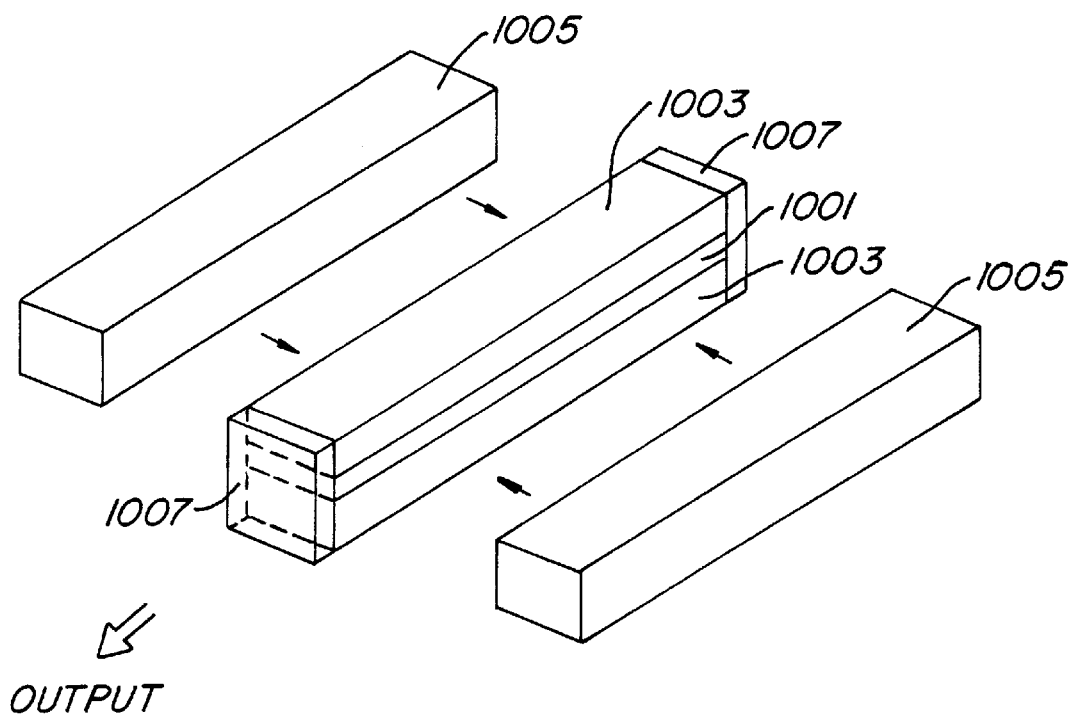
FIG. 10 schematically illustrates a waveguide laser.

FIG. 10 schematically illustrates one embodiment of a waveguide laser. As shown, a gain volume 1001 (e.g., Yb:YAG) is bonded to and sandwiched between two sapphire blocks 1003, the bond interfaces fabricated in accordance with the present invention. The laser may be configured for either continuous or quasi-continuous lasing, depending upon the temporal pump format of the pump sources. Preferably two laser diode bars 1005 transversely excite active region 1001. Two dielectric mirrors 1007, preferably directly deposited on the laser, form the laser cavity and lead to a simple and rugged monolithic laser design. The nominal dimensions of gain element 1001 are 10 μm thick by 1 cm long by 0.25 cm wide. The two sapphire blocks 1003, nominally 0.5 mm thick, serve the dual purpose of providing a waveguide cladding region and of providing a high thermal conductivity path to copper chill bars (not shown). The chill bars remove waste heat. Considering the pump radiation, the waveguide confines the pump to gain medium 1001 as it propagates through the slab. Because the guiding region can be thin, on the order of 10 μm, the pump irradiance can be maintained at very high values (i.e., 10's of $kW/cm^2$). This ability to generate and maintain high irradiance pump values without the need for complicated optical conditioning of the laser diode arrays is one of the unique features of the waveguide approach of the present invention.

In addition to the pump radiation, the thin waveguide dimension also serves to confine the laser radiation in the vertical dimension. For both the pump and the laser radiation, the numerical aperture, or NA, is the parameter that describes the maximum propagation angle measured in air (actually the sine of that angle) that can be captured by the waveguide. In terms of the refractive indices of the guiding and cladding layers, the NA is given by, $$NA = \sqrt{n_Y^2 - n_S^2},$$

where $n_Y$ is the index of YAG and equals 1.82 and $n_S$ is the index of sapphire and equals 1.76. These refractive index values give a NA of 0.46, which means the maximum angle of divergence from the pump beam that can still be captured by the waveguide is the sin of 0.46 or 27.6 degrees. The large NA and acceptance angle of the waveguide open up the possibility of directly coupling laser diode bars to the edge of the waveguide without the need for any intervening cylindrical micro-optics. Although this requires the precision placement of the laser diode bar with respect to the waveguide location, the benefit of not requiring a microlens in the system is a significant contribution to the system's simplicity, cost to construct, and overall robustness. Assuming each laser diode bar generates a maximum of 20 W of continuous (CW) pump power, the waveguide laser can generate output powers greater than 10 W CW at room temperature. A Yb doping concentration of $1.6 \times 10^{21}/cm^3$ (~12 atomic %) has been optimized to give the maximum laser output for the full input pump power of 40 W. Of particular importance to the generation of a near diffraction limited output laser beam in the horizontal, or non-waveguide direction, is the low value of output coupler reflectivity that optimizes the laser output power. The optimum output coupler reflectivity in the case of the Yb:YAG system is ~0.3. This feature of having a low reflectivity value for the output coupler that optimizes laser performance is a general feature of lasers using the waveguide architecture, and results from the small mode volume and resultant high gain of the laser.

In another embodiment using the same approach as outlined above for the cw laser, a waveguide laser is operational in a passively q-switched lasing mode. For example, instead of using the Yb:YAG gain medium for medium 1001, a co-doped $Yb^{3+},Cr^{4+}$:YAG or composite $Cr^{4+}$:YAG/$Yb^{3+}$:YAG sample may be used. The $Cr^{4+}$ that is introduced into the laser cavity serves as a saturable absorber. The $Cr^{4+}$ ion, when doped into YAG, is known to have an absorption band that extends out to roughly 1200 nanometers. Absorption in this $Cr^{4+}$ band results in an excited state having a measured luminescence lifetime of approximately 8 μs, as determined from monitoring its 1.4 μm fluorescence, making it an ideal candidate for a saturable absorber in a 1 micron laser cavity.

Using the same cw pump format as for the cw laser in which up to 40 W of cw 941 nm pump radiation is delivered to the side of the laser crystal, the laser with the saturable absorber in the cavity outputs a repetitive train of q-switched pulses. Because the same high gain situation that enabled the generation of high beam quality output beams in the cw case pertains here, it is possible to generate high beam quality q-switched output pulses using the same unstable strip-resonator geometry.

One particular aspect of passively q-switched lasers such as are described here, is the pump power dependence of the output pulse energy and pulse repetition frequency. Because the saturable absorber is tripped from its unbleached to bleached state at a given gain in the laser cavity, the output q-switched pulse energy is independent of the pump power. The pump power only controls how fast the system recovers back to the point at which it can again trip the saturable absorber from its unbleached to bleached state. Therefore, it only controls the pulse repetition frequency and average output laser power of the system, but not the output pulse energy.

As a result of being able to generate these high pump irradiances according to the present invention, a number of rare earth 3+ ions, as detailed in Table III by way of example, can be efficiently excited and used as lasants with the same generic architecture. Significantly, pump irradiances characteristic of bleach wave pumping which is required for the efficient excitation of quasi-three level laser systems, are easily obtained using the waveguide approach presented here. Each of these lasing wavelengths has their own set of useful properties and applications.

TABLE III

| Ion | Lasing Wavelength | Pump Wavelength |
|---|---|---|
| $Nd^{3+}$ | 1.06 μm | 808 nm |
| $Nd^{3+}$ | 946 nm | 808 nm |
| $Nd^{3+}$ | 1.3 μm | 808 nm |
| $Tm^{3+}$ | 2.02 μm | 785 nm |
| $Er^{3+}$ | 1.5 μm | 963 nm |
| $Er^{3+}$ | 2.94 μm | 963 nm |
| $Yb^{3+}$ | 1.03 μm | 941 nm |

Figure 11:
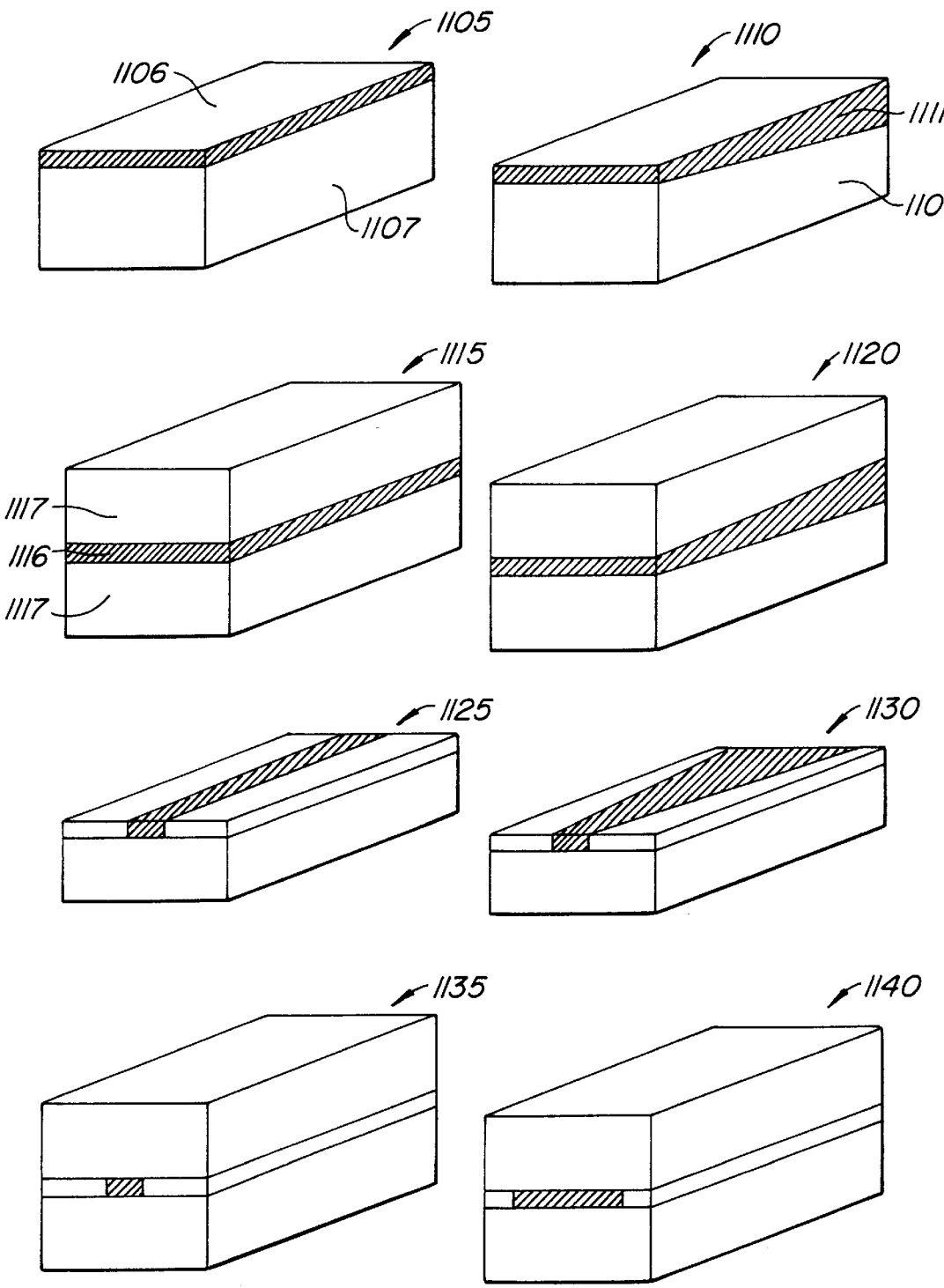
FIG. 11 illustrates some simple waveguide configurations according to the present invention.

FIG. 11 illustrates some simple waveguide configurations according to the present invention. In the following cases the input and output faces are precision polished and the appropriate optical coatings are deposited after the composite has been fabricated. The thickness of the guiding layer depends upon the intended application, ranging from about 500 micrometers for multimode operation to about 4 micrometers for single mode operation. Device 1105, a simple planar structure that may be used for concentrating laser radiation, consists of a guiding layer 1106 of a nonlinear optical crystal bonded to a substrate 1107 of lower refractive index. Device 1110 is a similar device with a wedge-shaped guiding layer 1111, thus further concentrating the laser radiation passing through it. Device 1115, a planar waveguide structure with a guiding layer 1116 sandwiched between two cladding layers 1117, requires two bonds according to the present invention. Device 1120 is a wedge-shaped sandwich. Devices 1125 and 1130 are examples of devices with three bonds. Waveguide structures 1135 and 1140 have buried cores of square and rectangular cross sections, respectively. Rhombohedral or hexagonal cross sections (not shown) are also possible and may have advantages in some circumstances but are usually restricted to thicknesses of about 300 to 600 micrometers.

Figure 12:
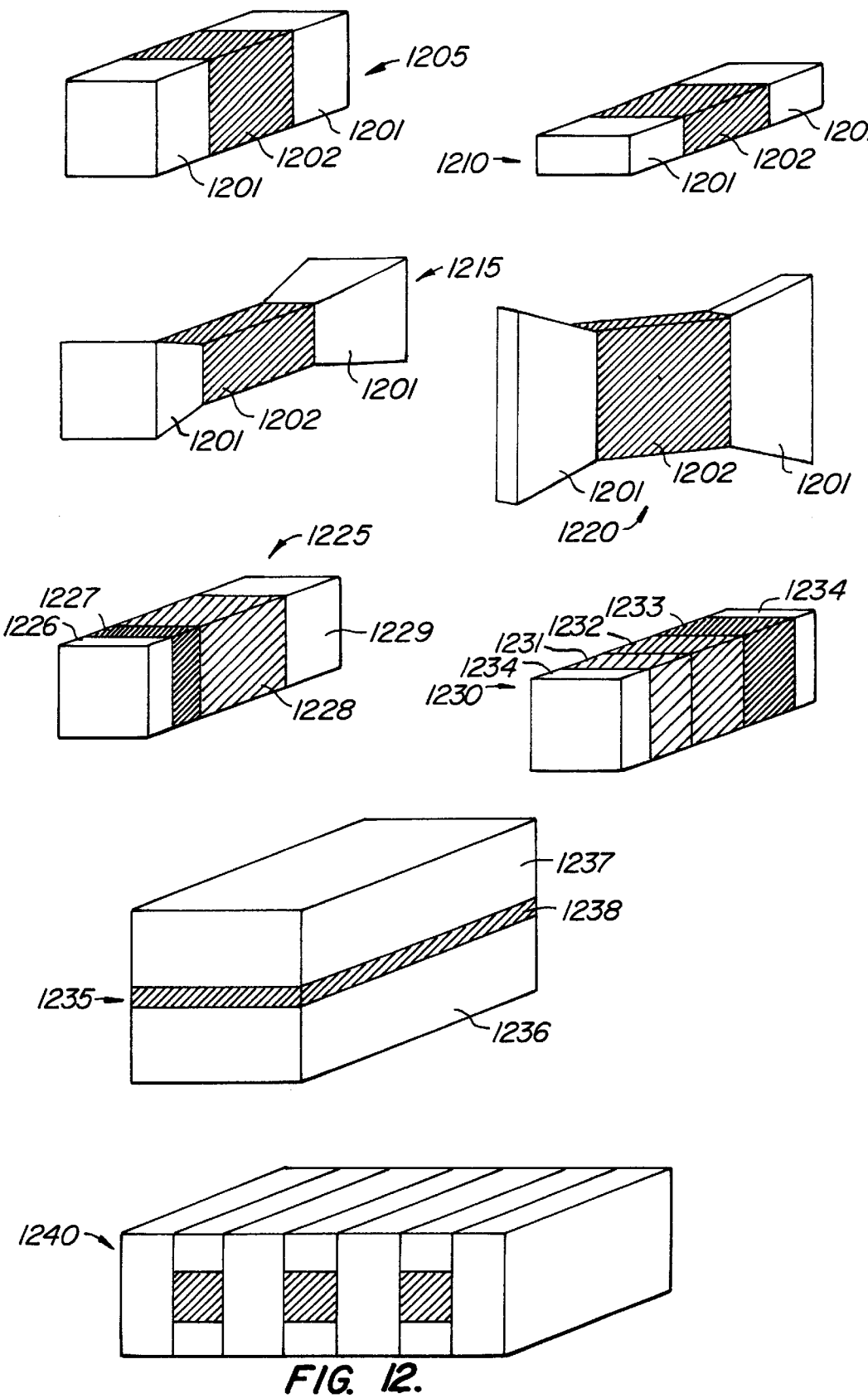
FIG. 12 illustrates some waveguide configurations comprising combinations of laser-inactive and laser-active layers.

Waveguiding configurations consisting of combinations between laser-inactive and laser-active layers are illustrated in FIG. 12. Since waveguide lasers are usually end-pumped, an important feature of the present invention is realized by bonding undoped sections 1201 of the corresponding undoped material to both ends of a core 402 as illustrated by device structures 1205 and 1210. This construct provides a means of conducting the heat of absorption of the incident pump radiation away from the doped section of the core and avoids overheating the optical coatings of the device, thereby increasing the capabilities for high power laser operation without damage to the optical coatings. Undoped end sections 1201 in device structures 1215 and 1220 concentrate pump radiation. They are fabricated separately from the laser-active waveguide module and subsequently bonded to it. Device structure 1225 has a core consisting of an undoped end section 1226, a passive Q-switch 1227, a laser-active section 1228, and an undoped end section 1229, all of which are bonded together. For example, such a structure could be composed of undoped YAG, $Cr^{4+}$:YAG, Nd:YAG, and undoped YAG, respectively. Device structure 1230 shows a composite that is useful when the thermal conductivity of the electro-optical material is not sufficiently high to conduct the absorbed pump radiation away, even with undoped end sections. Structure 1230 consists of sections 1231, 1232, and 1233 of varying dopant concentrations along with undoped end sections 1234. The sections are bonded together using the techniques of the present invention. Typically section 1231 would be of a lower dopant concentration than section 1232, and the concentration in section 1233 would be equal to or different from the concentration in 1231. Waveguide structure 1235 has a double layer of claddings where the refractive index of inner cladding 1236 is higher than that of outer cladding 1237, but lower than that of the core 1238. This type of device may be used to guide pump radiation into the core by end pumping. An array of laser-active or inactive waveguides can be constructed, as illustrated by device 1240. Although device 1240 is a one-dimensional array, two-dimensional arrays are equally feasible. Structures where the core of the waveguide is hollow and the walls are of optical quality in surface figure and smoothness are also feasible by the same techniques of composite formation according to the present invention. These examples illustrate the wide range of device configurations, and should not be considered to limit the scope of the invention.

Figure 13:
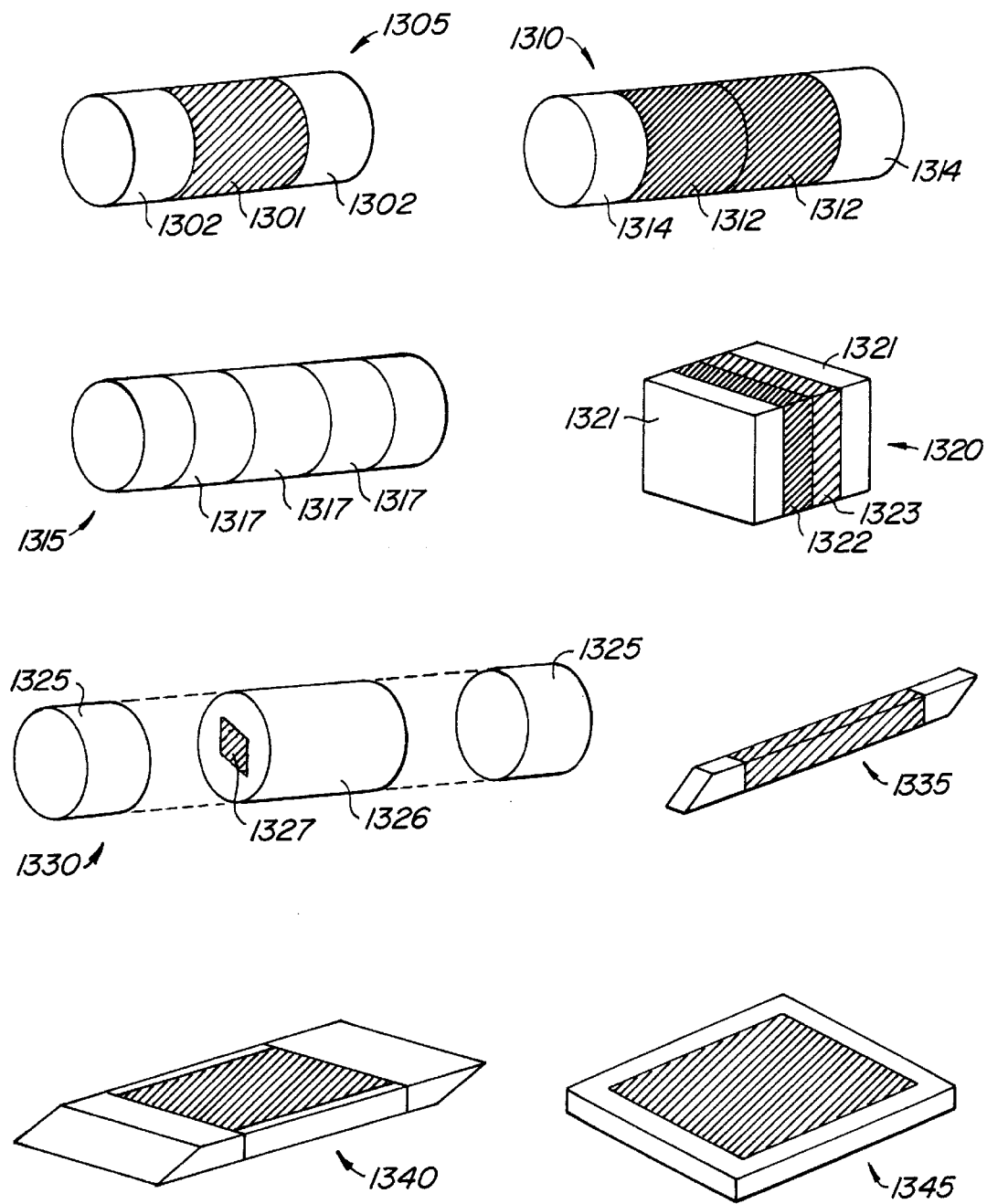
FIG. 13 illustrates a wide range of laser components of solid state laser systems fabricated according to the present invention.

FIG. 13 illustrates a wide range of useful and novel lasing components of solid state laser systems fabricated according to the present invention. Undoped and doped sections are bonded together below the temperature region where substantial interdiffusion between the surfaces forming the interface is believed to occur. The lower treatment temperature circumvents problems associated with phase transitions, appearance of latent scratches, and stress birefringence. The composite cores of waveguide laser devices 1225 and 1230 are analogous to generic configurations 1305 and 1310. The features and functions of the undoped end section(s) include: (i) providing a heat sink for end- or side-pumped laser operation, thereby protecting the optical coatings from overheating; (ii) eliminating ground state absorption losses in quasi-three-level laser systems by allowing the entire lasing medium to be pumped, resulting in improved efficiency and less heat generation; (iii) avoiding thermal distortion of the rod or slab ends, resulting in improved beam quality; (iv) insuring that the pumped region and the mode volume of the laser rod are congruent by confining dopant ions to the region which is traversed by the laser mode (deviations from this condition usually result in large efficiency losses in the laser cycle as well as contributing to waste heat); (v)

increasing the length of small components by adding one or more functional undoped sections so that they can be more conveniently fabricated or handled; and (vi) avoiding spatial hole burning in overlap regions of laser beams inside a laser cavity.

The basic composite design of a doped rod 1301 with undoped end sections 1302 is illustrated by device 1305. Structure 1310 illustrates a composite where a long laser rod is constructed by bonding two core-drilled rods 1312 on end together to obtain a symmetric gradient of dopant concentration in a rod length. Not only would a similar construct using the prior art fabrication techniques be very expensive, the prior art based rod cannot yield equivalent quality. Undoped end sections 1314 further improve laser operation in this device. Device structure 1315 is a composite rod consisting of doped sections 1317 of different concentrations, thus permitting the user to design a desirable pattern of pump radiation absorption. The present invention also allows the design of solid state laser components that have more than one function. For example, structure 1320 is a YAG laser chip containing undoped ends 1321, a $Cr^{4+}$:YAG slab 1322 as a passive Q-switch, and a Nd:YAG slab 1323 as the lasing medium. A composite rod consisting of undoped ends 1325 and a cladding 1326 surrounding a core 1327 of hexagonal cross section is depicted in device 1330. It is obvious that the fabrication of a clad rod with polygonal cross section may also yield many thin disks with a clad central section just by slicing a rod such as that of device 1330 into sections of desired thickness. The improved thermal uniformity due to the cladding improves the beam pointing stability of the laser operation. Composite slabs with undoped ends only or undoped ends and cladding or cladding only are represented by devices 1335, 1340, and 1345, respectively. The advantages of such devices over the prior art are analogous to those of composite rods. Differences between composite configurations for cores of waveguide lasers and for the devices with claddings shown in FIG. 13 are mainly in terms of dimensions, with the waveguide lasers having a cladding of lower refractive index bonded to their laser-active core. Many other useful composite configurations are possible for laser rods, laser slabs and laser chips. FIG. 13 only shows a few of the possibilities.

As still another illustration of the usefulness of the present invention, preforms of composite glasses can be manufactured according to the present fabrication techniques. The preforms can then be redrawn into fiber-like composite glass configurations that in turn can be used to mass produce laser heads for miniature solid state lasers.

Composite glass preforms, preferably with flat interfaces between the laser active glass core and the inactive glass cladding layers, can be made of fiberable glasses according to the present invention. Such preforms have by way of example a 10–20 fold proportional increase in cross sectional linear dimensions and are of about 6 inches to several feet long. The preforms are redrawn according to known methods in a temperature-controlled environment at a suitable glass viscosity, thereby reducing their cross sectional linear dimensions exactly 10–20 fold in the same proportions as existing in the preform. This results in a linear increase of the drawn composite fiber length over the preform by a factor of $10^2$–$20^2$ fold respectively. Subsequently, this length of fiber can be cut into small lengths, e.g. 11 mm each, which contains a laserable core of the desired dimensions that can be as small as a few micrometers to about 1 mm sandwiched between two cladding layers. The end faces of this small length of fiber can then be precision polished in fixtures holding 50, 100 or more parts at one time, yielding 50, 100 or more composite glass waveguiding elements for solid state lasers.

The present invention is also useful and unique in producing composite waveguiding configurations from glasses which are not fiberable due to their tendency to devitrify during fiber pulling or redrawing. These types of glasses include fluoride, fluorophosphate, and chalcogenide fibers which have useful properties as solid state lasers but cannot be made into fibers or waveguide structures by any prior art glass forming technique. These types of glasses are melted with laserable dopant ions such as $Pr^{3+}$, homogenized as melt, and then cast and quenched to avoid devitrification during cooling. Heat treatment above their glass transition temperature would result in devitrification.

As will be understood by those familiar with the art, the present invention may be embodied in other specific forms without departing from the spirit or essential characteristics thereof Accordingly, disclosure of the preferred embodiment of the invention is intended to be illustrative, but not limiting, of the scope of the invention as set forth in the following claims.

What is claimed is:

1. A composite garnet prepared by a process comprising the steps of:
   optically contacting surfaces of a first and a second garnet to form an assembly comprising an optically contacted interface, wherein said optically contacted interface is indicated by a complete disappearance of interference fringes at said interface; and
   bonding said optically contacted interface by gradually heating said assembly to a bonding temperature below the fusion temperature of said first and second garnets, but at a temperature and for a time sufficient to diffusion bond said optically contacted surfaces.

2. The composite garnet of claim 1, wherein said first garnet has a first melting temperature and said second garnet has a second melting temperature, and wherein said bonding temperature is a temperature corresponding from about 0.4 to about 0.9 times the value of the lower of said first and second melting temperatures.

3. The composite garnet of claim 1, wherein said first and second garnets are selected from the group consisting of naturally occurring garnets and artificially grown garnets.

4. The composite garnet of claim 1, wherein said first and second garnets are selected from the group consisting of yttrium aluminum garnet, aluminum oxide derived gemstones, red Almadine garnets, and gadolinium gallium garnet.

5. The composite garnet of claim 1, wherein said composite garnet is cut and polished after said steps of optical contacting and bonding.

6. The composite garnet of claim 1, further comprising a third garnet, wherein a surface of said third garnet is optically contacted to a surface of said bonded assembly, and wherein said optically contacted surface of said third garnet is bonded by gradually heating to a bonding temperature below the fusion temperature of said assembly and said third garnet, but at a temperature and for a time sufficient to diffusion bond said optically contacted surfaces of said assembly and said third garment.

7. A composite garnet, comprising:
   a first garnet; and
   a second garnet bonded to said first garnet using a non-adhesive bonding technique, wherein a bonded interface between said first garnet and said second garnet exhibits negligible optical scatter, and wherein said bonded interface exhibits sufficient strength to allow said composite garnet to be cut and polished after said first and second garnets are bonded.

8. The composite garnet of claim 7, wherein said first and second garnets are selected from the group consisting of naturally occurring garnets and artificially grown garnets.

9. The composite garnet of claim 7, further comprising a third garnet, wherein said third garnet is either bonded to said first garnet, to said second garnet, or to said first and second garnets using a non-adhesive bonding technique.

10. A method of fabricating a composite garnet, comprising the steps of:

optically contacting a surface of a first garnet to a surface of a second garnet to form an optically contacted interface, wherein said optically contacted is indicated by a complete disappearance of interference fringes at said interface; and bonding said optically contacted interface by gradually heating said interface to a bonding temperature below the fusion temperature of said first and second garnets, but at a temperature and for a time sufficient to diffusion bond said optically contacted surfaces.

11. The method of fabricating a composite garnet of claim 10, wherein said first garnet has a first melting temperature and said second garnet has a second melting temperature, and wherein said bonding temperature is a temperature corresponding from about 0.4 to about 0.9 times the value of the lower of said first and second melting temperatures.

12. The method of fabricating a composite garnet of claim 10, wherein said first and second garnets are selected from the group consisting of naturally occurring garnets and artificially grown garnets.

13. The method of fabricating a composite garnet of claim 10, wherein said first and second garnets are selected from the group consisting of yttrium aluminum garnet, aluminum oxide derived gemstones, red Almadine garnets, and gadolinium gallium garnet.

14. The method of fabricating a composite garnet of claim 10, further comprising the steps of cutting and polishing said composite garnet, said cutting and polishing steps occurring after said optical contacting and bonding steps.

* * * * *